United States Patent
Jayaraman et al.

(10) Patent No.: US 12,222,308 B2
(45) Date of Patent: Feb. 11, 2025

(54) METHODS FOR MAKING ELECTRODES AND PROVIDING ELECTRICAL CONNECTIONS IN SENSORS

(71) Applicant: CORNING INCORPORATED, Corning, NY (US)

(72) Inventors: Shrisudersan Jayaraman, Horseheads, NY (US); Navaneetha Krishnan Subbaiyan, Portland, OR (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 18/515,508

(22) Filed: Nov. 21, 2023

(65) Prior Publication Data

US 2024/0085361 A1    Mar. 14, 2024

Related U.S. Application Data

(62) Division of application No. 16/959,236, filed as application No. PCT/US2018/067812 on Dec. 28, 2018, now Pat. No. 11,846,597.

(Continued)

(51) Int. Cl.
*G01N 27/28*    (2006.01)
*C03C 17/06*    (2006.01)
(Continued)

(52) U.S. Cl.
CPC ........... *G01N 27/283* (2013.01); *C03C 17/06* (2013.01); *C03C 17/10* (2013.01); *G01N 27/36* (2013.01);
(Continued)

(58) Field of Classification Search
None
See application file for complete search history.

(56) References Cited

U.S. PATENT DOCUMENTS 6,845,664 B1    1/2005  Okojie
6,979,872 B2   12/2005  Borwick et al.
(Continued)

FOREIGN PATENT DOCUMENTS

CN    105388201 A    3/2016
TW       577982 B    3/2004
(Continued)

OTHER PUBLICATIONS

Aoki, "Theory of ultramicroelectrodes" Electroanalysis, vol. 5, Issue 8, Sep. 1993, pp. 627-639.
Beica et al., "Advanced Metallization for 3D Integration," In 10th Electronics Packaging Technology Conference, EPTC 2008, pp. 212.
(Continued)

*Primary Examiner* — Michael P. Rodriguez
(74) *Attorney, Agent, or Firm* — Svetlana Z. Short

(57) ABSTRACT

A method of forming a sensor, such as a glass electrochemical sensor, is described. In some examples, the method may include forming a plurality of apertures in a glass substrate; forming a sensor body comprising the glass substrate and at least one glass sensor component, wherein one or more apertures of the glass substrate are aligned with the at least one glass sensor component to form an outer contact aperture; filling the outer contact aperture in the sensor body with a first conducting material to form an outer contact through glass via (TGV); and forming an electrode on the glass substrate adjacent at least one of the apertures of the plurality of apertures.

14 Claims, 12 Drawing Sheets

Related U.S. Application Data

(60) Provisional application No. 62/613,275, filed on Jan. 3, 2018.

(51) Int. Cl.
*C03C 17/10* (2006.01)
*G01N 27/36* (2006.01)
*H01L 23/498* (2006.01)

(52) U.S. Cl.
CPC .... *H01L 23/49827* (2013.01); *C03C 2218/34* (2013.01)

(56) References Cited

U.S. PATENT DOCUMENTS

| | | | |
|---|---|---|---|
| 9,278,886 | B2 | 3/2016 | Boek et al. |
| 9,321,680 | B2 | 4/2016 | Chuang et al. |
| 2004/0084328 | A1 | 5/2004 | Jones et al. |
| 2005/0029669 | A1* | 2/2005 | Inoue ................ H01L 23/53238 257/E21.589 |
| 2010/0147070 | A1 | 6/2010 | Jun et al. |
| 2014/0202856 | A1 | 7/2014 | Roxhed et al. |
| 2015/0049498 | A1 | 2/2015 | Zhou |
| 2015/0346138 | A1* | 12/2015 | Allen ................... G01N 27/404 204/414 |
| 2016/0172310 | A1 | 6/2016 | Zhai |
| 2017/0287728 | A1 | 10/2017 | Dahlberg et al. |
| 2019/0024237 | A1 | 1/2019 | Jayaraman |
| 2020/0173956 | A1 | 6/2020 | Bellman et al. |

FOREIGN PATENT DOCUMENTS

| | | |
|---|---|---|
| TW | I223066 B | 11/2004 |
| WO | 2015/100056 A1 | 7/2015 |
| WO | 2016/015028 A1 | 1/2016 |

OTHER PUBLICATIONS

Berduque et al., "Voltammetric characterisation of silicon-based microelectrode arrays and their application to mercury-free stripping voltammetry of copper ions," vol. 71, Issue 3, Feb. 28, 2007, pp. 1022-1030.
Bernhard et al., "Fabrication and characterization of microwell array chemical sensors," Analytical Chemistry, vol. 73, 2001, pp. 2484-2490.
Cao et al., "Wafer-Level Package With Simultaneous TSV Connection and Cavity Hermetic Sealing by Solder Bonding for MEMS Device", IEEE Transactions on Electronics Packaging Manufacturing, vol. 32, 2009, p. 125-132.
Gao et al., "Preparation of metallic nanopore arrays using template-guided electrochemical etching", Materials Letters, vol. 64, 2010, pp. 1028-1030.
Huang et al., "Microelectrode Arrays for Electrochemistry: Approaches to Fabrication", Small, vol. 5, No. 7, 2009, pp. 776-788.
International Search Report and Written Opinion of the International Searching Authority; PCT/US2018/067812; Mailed Apr. 24, 2019; 14 Pages; Korean Intellectual Property Office.
Kang et al., "Diamond ultramicroelectrode chemical sensing arrays", In 5th IEEE Conference on Sensors, 2006, pp. 576-579.
Koda et al., "Electrodeposition of platinum and silver into chemically modified microporous silicon electrodes," Nanoscale Research Letters, vol. 7, 2012, Article No. 330.
Kutchoukov et al., "A Through-wafer interconnect technology for silicon," Journal of Micromechanics and Microengineering, vol. 14, 2004, p. 1029.
Lee et al., "Through-glass copper via using the glass reflow and seedless electroplating processes for wafer-level RF MEMS packaging," J. Micromech. Microeng, vol. 23, 2013, p. 085012.
Pebay et al., "Mass transport at infinite regular arrays of microband electrodes submitted to natural convection: theory and experiments," Anal. Chem., vol. 85, 2013, pp. 12062-12069.
Spira et al., "Multi-electrode array technologies for neuroscience and cardiology", Nature Nanotechnology, vol. 8, 2013, pp. 83-94.
Taiwanese Patent Application No. 108100155, Office Action dated Sep. 6, 2022, 5 pages (English translation only), Taiwanese Patent Office.

* cited by examiner a.

b.

METHODS FOR MAKING ELECTRODES AND PROVIDING ELECTRICAL CONNECTIONS IN SENSORS

CROSS REFERENCE TO RELATED APPLICATIONS

This application is a divisional of U.S. application Ser. No. 16/959,236 filed Jun. 30, 2020, which claims the benefit of priority under 35 U.S.C § 371 of International Application No. PCT/US2018/067812, filed on Dec. 28, 2018, which claims the benefit of priority of U.S. Provisional Application Ser. No. 62/613,275 filed on Jan. 3, 2018 the contents of which are relied upon and incorporated herein by reference in their entirety as if fully set forth below.

BACKGROUND

The deployment of mobile, low cost sensors in phones, tablets, automobiles, healthcare products, and many consumer products is a global technology mega-trend that is attracting major investment in developing miniaturized, low cost designs of many existing sensor technologies. Sensors such as accelerometers, gyroscopes, microphones, cameras, and light sensors are manufactured in tens of millions of units per month in form factors that are compatible with mobile devices and consumer electronics. These sensors are typically produced having dimensions of just a few square millimeters, and are typically very low cost. Mobile phones and other personal mobile electronics are driving this market along with the integration of sensors in many new and existing products such as home appliances, wearable health monitors, and industrial equipment. This connected sensor deployment is a global mega-trend known as "The Internet of Things" (IoT).

Through-substrate vias (TSVs) have garnered interest as they enable thin silicon vias (TSiV) and through glass via (TGV) based technologies that provide high packaging density, reduced signal path, wide signal bandwidth, lower packaging cost, and extremely miniaturized systems. The TSVs are also attractive for sensing applications, specifically chemical sensing applications. Electrochemical sensors are an important subclass of chemical sensors. These devices may be used to sense a broad range of chemicals, ranging from toxic gases to biological compounds. These devices function by monitoring changes in conductivity, potential, or current between electrodes in a cell containing an electrolyte. Typically, electrochemical sensors are made of multiple layers that are metalized as separate layers and then precisely aligned and bonded together in a complex process.

SUMMARY

The present disclosure is directed to a method for forming a glass electrochemical sensor. In some embodiments, the method may include forming a plurality of apertures in a glass substrate; forming a sensor body including the glass substrate and at least one glass sensor component, wherein one or more apertures of the glass substrate are aligned with the at least one glass sensor component to form an outer contact aperture, filling the outer contact aperture in the sensor body with a first conducting material to form an outer contact through glass via (TGV), and forming an electrode on the glass substrate adjacent at least one of the apertures of the plurality of apertures.

In some embodiments, the method may further include metalizing the filled outer contact TGV and at least a portion of one or more electrode vias; and depositing a contact layer on the top surface of the sensor body from the outer contact TGV across one or more of the electrode vias on a top surface of the sensor body, wherein the contact layer electrically connects the one or more electrode vias to the outer contact TGV.

In some embodiments, the method may further include filling one or more electrode apertures in the glass substrate with the first conducting material to form one or more electrode vias.

In some embodiments, the method may further include depositing a masking layer around the contact layer, wherein the contact layer is between the plurality of apertures and the masking layer, metallizing at least a portion of one or more electrode vias with a second conducting material, and removing the masking layer.

In some embodiments, the first conducting material of the outer contact TGV is different than the second conducting material of the one or more electrode vias.

In some embodiments, forming the electrode on the glass substrate and metalizing the filled outer contact TGV at least a portion of the one or more electrode vias is performed by bottom up plating.

In some embodiments, the method may further include depositing an electrode material in a portion of the at least one of the electrode vias.

In some embodiments, the electrode on the glass substrate of the sensor body form a continuous electrode layer across a portion of the electrode vias.

In some embodiments, the electrode on the glass substrate of the sensor body form a discontinuous electrode layer across a portion of the electrode vias.

In some embodiments, the electrode on the glass substrate of the sensor body is configured as a microelectrode.

In some embodiments, the electrode on the glass substrate of the sensor body is configured as a macroelectrode.

In some embodiments, the electrode may include platinum, silver, gold, copper, an alloy, a metal oxide, a conductive polymer or a combination thereof.

In some embodiments, the first and second conductive material may include stainless steel, copper, gold, aluminum, silver, platinum, tin, lead, an alloy, a metal oxide, a conductive polymer, or a combination thereof.

In some embodiments, the method may further include bonding the glass substrate and the glass sensor component of the sensor body such that the electrode is positioned between the glass substrate and the glass sensor component.

In some embodiments, forming a plurality of apertures in the glass substrate further includes forming the plurality of apertures with a laser.

In some embodiments, forming the plurality of apertures with a laser includes a laser ablation process or a laser damage process to localized areas followed by etching of the localized areas.

In some embodiments, depositing the contact layer is performed by thin film deposition.

In some embodiments, the method may further include forming at least two electrodes on a bottom surface of the glass substrate; wherein forming a plurality of through glass vias (TGVs) in the glass substrate includes: forming at least two electrode vias, each of the at least two electrode vias corresponding to and electrically connecting to the at least two electrodes; and forming a connection bridge between each of the at least two electrode vias and at least one of at least two of the outer contact TGVs, wherein the connection bridge comprises a contact layer.

In some embodiments, each of the at least two electrodes comprise a unique composition.

In some embodiments, the method may further include filling the sensor body with an electrolyte.

In some embodiments, filling the outer contact aperture includes depositing material by at least one of paste-filling, electroplating, physical vapor deposition, chemical vapor deposition, or atomic-layer deposition.

In some embodiments, the glass sensor component and the glass substrate comprises at least one of Pyrex®, quartz, soda-lime glass, aluminosilicate glass, alkali-aluminosilicate glass, borosilicate glass, alkali-borosilicate glass, aluminoborosilicate glass, alkali-aluminoborosilicate glass, or fused silica glass.

In some embodiments, the sensor is an electrochemical sensor configured to measure resistance.

The present disclosure is also directed to a glass electrochemical sensor having a glass sensor body comprising a plurality of through glass vias (TGVs), wherein one or more outer contact apertures of two or more glass sensor components are configured to be aligned when empty; an outer contact TGV of the glass sensor body comprising the one or more outer contact apertures at least partially filled with a conducting material; an electrode disposed on a surface of the glass sensor body adjacent to at least one of the TGVs, wherein the electrode is between the two or more glass sensor components; and an access hole in the glass sensor body configured to allow access to the electrode.

In some embodiments, the two or more glass sensor components comprise a glass substrate that comprises the outer contact TGV and one or more electrode vias.

In some embodiments, the electrochemical sensor may further include at least two electrodes disposed on the surface of the glass sensor component, wherein at least two of the plurality of TGVs are electrode vias that include conductive material that is electrically connected to the at least two electrodes.

In some embodiments, the plurality of electrode vias are positioned around a center of the glass sensor body, and the plurality of outer contact TGVs are positioned about a periphery of the glass sensor body.

In some embodiments, the glass sensor body of the electrochemical sensor may further include a plurality of outer contact TGVs containing a conductive material, and a plurality of contact layers electrically connecting the conductive material in the electrode vias with the conductive material in the outer contact TGVs.

In some embodiments, the two or more glass sensor components are bonded together such that the glass sensor body is sealed by glass on all sides except the side defined by the glass substrate.

In some embodiments, the two or more glass sensor components are bonded together by at least one of adhesive, glass frit, or laser sealing.

In some embodiments, the glass sensor body, glass sensor components, and glass substrate comprises at least one of Pyrex®, quartz, soda-lime glass, aluminosilicate glass, alkali-aluminosilicate glass, borosilicate glass, alkali-borosilicate glass, aluminoborosilicate glass, alkali-aluminoborosilicate glass, or fused silica glass.

In some embodiments, an electrolyte at least partially fills the access hole and is in contact with the electrode.

The present disclosure is further directed to an electronic device including the glass electrochemical sensor as previously recited.

One or more representative embodiments is provided to illustrate the various features, characteristics, and advantages of the disclosed subject matter. The embodiments are provided in the context of glass electrochemical sensors. It should be understood, however, that many of the concepts may be used in a variety of other settings, situations, and configurations. For example, the features, characteristics, advantages, etc., of one embodiment may be used alone or in various combinations and sub-combinations with one another.

The Summary is provided to introduce a selection of concepts in a simplified form that are further described below in the Detailed Description. The Summary and the Background are not intended to identify key concepts or essential aspects of the disclosed subject matter, nor should they be used to constrict or limit the scope of the claims. For example, the scope of the claims should not be limited based on whether the recited subject matter includes any or all aspects noted in the Summary and/or addresses any of the issues noted in the Background.

BRIEF DESCRIPTION OF DRAWINGS

The preferred and other embodiments are disclosed in association with the accompanying drawings in which.

DETAILED DESCRIPTION

The present disclosure relates to a process for manufacturing a glass-based electrochemical sensor for chemical and biochemical sensing systems including, but in no way limited to, an air quality sensor for mobile consumer electronic applications. Smaller devices enable incorporation in IOT applications like smart phones, wearables, automobiles, home security monitoring, and appliances, to name a few. Miniaturization of these devices makes use of glass as a material an attractive option due to its chemical durability, dimensional tolerances, coefficient of thermal expansion (CTE) match to silicon, temperature stability, and low gas permeability.

Conventional methods of sensor device assembly and fabrication are expensive due to the requirements for precision and complexity of the electrode fabrication and device assembly process. Specifically, precision alignment of metalized vias present a number of challenges. The present disclosure relates to a manufacturing process for sensors that enables simpler electrode and device fabrication by eliminating precision alignment of metalized layers, which allows for flexibility in the types of electrodes that can be fabricated. This disclosure lends itself to ease of device fabrication and also provides repeatable and reliable electrical connections, thus increasing the yield of the manufacturing process. In particular, this method may consist of first assembling the different structural components of the sensor and electrochemically metallizing through the apertures of the assembled device. For example, bottom up plating may be used to metalize the vias of the glass electrochemical sensor. The process described below allows for reliable electrical connections throughout the sensor and increased density of conducting material and electrode material in the sensor versus the use of a seed-layer deposition process or similar paste metallizing processes. In some examples, this process also allows for the use of multiple electrode materials within a single sensor. Seed-layer based metallization may suffer from several drawbacks including the need to apply a uniform seed layer in high-aspect ratio vias, complicated process control to prevent seams and voids in the metallized layer, complex and expensive electrolyte chemistry, etc.

Figure 1:
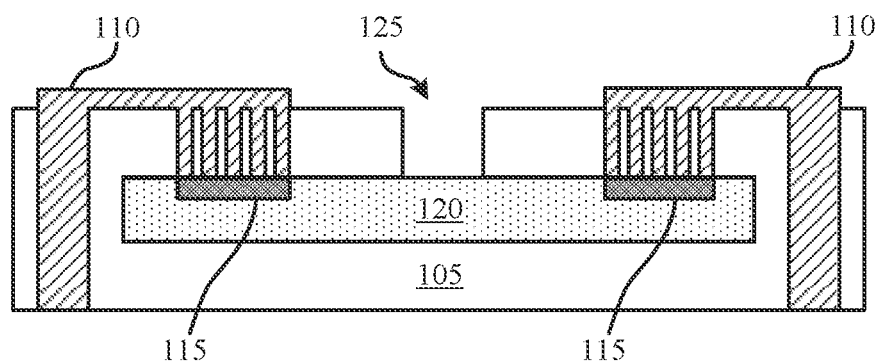
FIG. 1 illustrates a cross-sectional view of an example of glass-based electrochemical sensor in accordance with various aspects of the present disclosure.

FIG. 1 illustrates a cross-sectional view of an example of a glass-based electrochemical sensor 100 in accordance with various aspects of the present disclosure. As illustrated in FIG. 1, a sensor 100 may include a sensor body 105, a conducting material 110, electrodes 115, an electrolyte 120, and an access hole 125. The sensor 100 may be configured to be used for sensing a variety of analytes. For example, sensor 100 may be an electrochemical sensor that may measure the resistance of the analyte. The sensor 100 and sensor body 105 may include at least one of Pyrex®, quartz, soda-lime glass, aluminosilicate glass, alkali-aluminosilicate glass, borosilicate glass, alkali-borosilicate glass, aluminoborosilicate glass, alkali-aluminoborosilicate glass, or fused silica glass.

Conducting material 110 may have seamless electrical connections across the entire sensor 100 and sensor body 105. The metallization process of conducting material 110 allows for higher density throughout the sensor body 105. As the density of conducting material 105 increases, the sensitivity of the sensor may also increase. The conductive material 110 may be made up of any appropriate conductive material including, but in no way limited to, stainless steel, copper, gold, aluminum, silver, platinum, tin, lead, an alloy, a metal oxide a conductive polymer, or a combination thereof.

Multiple electrodes 115 may be present and each electrode 115 may act differently. For example, electrodes 115 may act as a sensing electrode, a counter electrode, reference electrode, and the like. At a counter electrode, an equal and opposite reaction occurs, such that if the sensing electrode is oxidized, the counter electrode is reduced. Electrodes 115 may be composed of any appropriately sensitive conductive material including, but in no way limited to, platinum, silver, gold, copper, an alloy, a metal oxide, a conductive polymer, or a combination thereof. An external circuit (not shown) may maintain the voltage or current across the sensor 100 and the electrodes 115.

Electrolyte 120 fills the cavity within the sensor body 105 and is in contact with both electrodes 115. The electrolyte 120 allows the transfer of electrons between electrodes 115. Although shown in a rectangular shape, the cavity may be configured in any shape.

Figure 2:
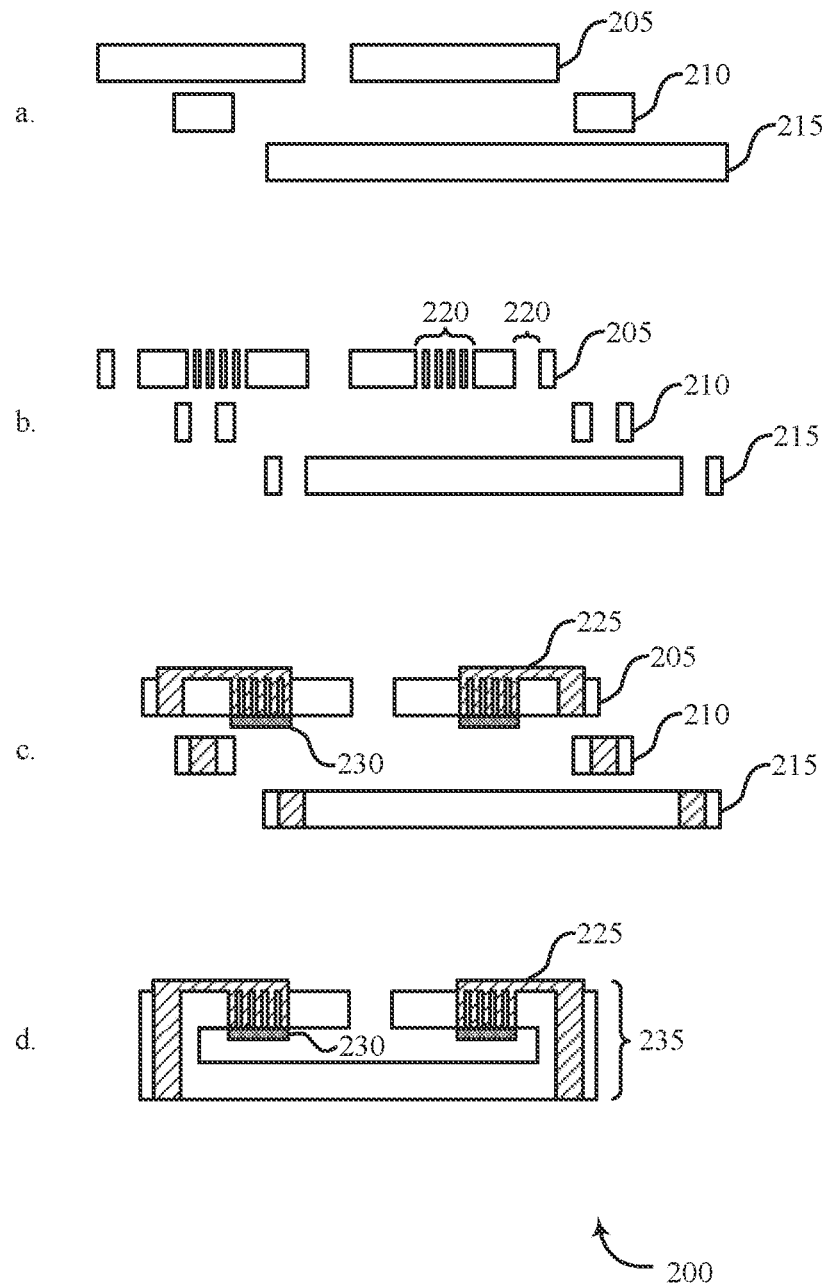
FIG. 2 illustrates a cross-sectional view of an example of a conventional method used for forming an electrochemical sensor.

FIG. 2 illustrates an example of a conventional method 200 used for forming an electrochemical sensor. As illustrated in FIG. 2, method 200 may include four stages a, b, c, and d. Traditionally, the method includes making holes in each component layer separately, metalizing the holes in each component layer separately, adding the electrodes where appropriate, and bonding the aligned metalized layers together.

As shown in stage a, the conventional method 200 starts with three layers 205, 210, and 215. These three layers may be glass layers. In stage b, holes 220 have been formed in each layer 205, 210, and 215 separately. In stage c, the holes 220 formed in stage b are individually metalized with a conducting material 225 by layer, and electrodes 230 are added to the first layer 205. Stages a, b, and c take place prior to assembling the layers 205, 210, and 215.

As shown in stage d, the three layers 205, 210, and 215 have been bonded together to form the final sensor 235. Challenges may arise when assembling the sensor 235 in stage d, in particular the conducting material 225 must be precisely aligned and in proper contact between each layer to allow proper sensor operation. The traditional alignment process may become very complex in order to provide precise alignment. The process complexity increases as the size of the sensor decreases. As the size of sensors continue to decrease there exists a need for a less complex method of forming sensors. In contrast to the conventional method 200 illustrated in FIG. 2, the present disclosure provides a system and method for reducing complexity and increasing yield in forming sensors illustrated in FIG. 3.

Figure 3:
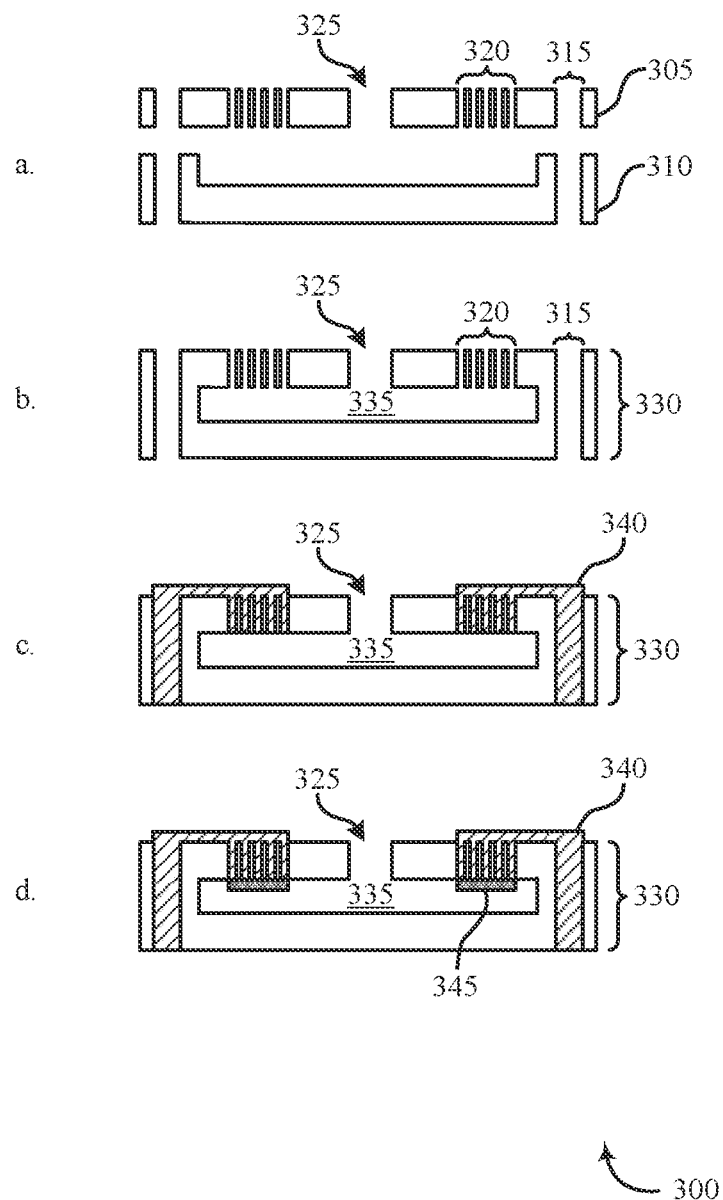
FIG. 3 illustrates a cross-sectional view of an example of a method for formation of a glass electrochemical sensor in accordance with various aspects of the present disclosure.

FIG. 3 illustrates an example of a method 300 for formation of a glass electrochemical sensor in accordance with various aspects of the present disclosure. In this example, there are four steps shown in method 300. In other examples, there may be more or less steps to the process by combining or dividing steps. This method 300 of forming a sensor will be explained in greater detail with respect to a glass electrochemical sensor, however, the method 300 may be applied to a variety of sensors.

As illustrated in FIG. 3, step a includes two glass layers 305 and 310. Two or more glass layers may make up the sensor. Glass layer 305 may also be referred to herein as a glass substrate. Glass layer 310 may also be referred to herein as a glass sensor component. Apertures 315 and 320 may be formed in glass substrate 305, and aperture 315 may be formed in glass sensor component 310. Apertures 315 and 320 may be formed on each side of the access hole 325. Apertures 315 may be formed on the outside or periphery of a sensor and may be referred to herein as outer contact apertures. Apertures 320 may be formed around the center of a sensor and may be referred to herein as electrode apertures. The electrode apertures 320 may be located between the access hole 325 and an outer contact aperture 315. Access hole 325 may be located in the center of the sensor. In some cases apertures 315 and 320 and access hole 325 may be a through glass via (TGV).

According to this exemplary method, precision laser technologies are used to form high throughput compatible TGVs, also called "vias" herein, and larger structural glass cavities with tight dimensional tolerances in glass wafers. The vias can be formed by the methods taught in, for example, International Pat. App. No. PCT/US2014/070459; U.S. Pat. Nos. 9,278,886; and 9,321,680, which references are incorporated herein by reference for all that they disclose. The vias can be formed to extend through a layer of glass, from one surface to another. The formation of vias that extend from a first surface of a layer of glass to another surface of a layer of glass enable the embedding of conductors to facilitate conductivity with appropriate electrodes within the cavity while providing electrical leads to a surface outside the cavity. The exemplary process enables miniaturization of the components, reducing their cost and facilitating their adoption into mobile or IoT applications.

As shown in FIG. 3, step b includes aligning layers 305 and 310 and then bonding the two layers 305 and 310 together to form the sensor body 330. Alignment of the layers may apply to the alignment of outer contact apertures 315 in both the glass substrate 305 and glass sensor component 310. High precision alignment may not be needed in process 300. The bonding of layers may be temporary or permanent. A cavity 335 is formed when the layers 305 and 310 are bonded together. The cavity may be accessed by access hole 325. Once the sensor body 330 is assembled, the process may continue to fill the apertures 315 and 320.

As illustrated in FIG. 3, step c includes filling and metalizing the apertures 315 and 320 with conducting material 340. As oriented in the drawings, the top of the sensor body 330 corresponds to the top of the page. Conducting material 340 may fill the outer contact aperture 315 to form an outer contact TGV, may fill the electrode apertures 320 to form electrode vias, and may be deposited along the top of the sensor body 330 from the electrode vias to the outer contact TGV. Because the apertures 315 and 320 of the sensor body 330 are metalized post assembly the electrical contact of the conducting material 340 is seamless and thus provide reliable transfer of electrons. The process of metalizing the apertures 315 and 320 may occur by bottom up plating.

Bottom up plating is an electrochemical redox reaction to electrodeposit metal that may take place in an electrochemical cell. For example, an electrochemical cell for bottom up plating may contain a power supply, a substrate electrode, an electrolyte, a counter electrode, and a deposition cell. A voltage or current may be applied across the electrodes allowing a half reaction to occur at each electrode. One half reaction is a reduction reaction and one is an oxidation reaction. If the voltage or current is great enough, an element of the electrolyte solution may displace an element on the electrode. In some examples, a substrate electrode may be stainless steel, indium tin oxide, nickel, or other metallic elements.

In this disclosure, two exemplary methods of bottom up plating will be described. The first method may be referred to as inverted bottom up plating. In this configuration, the sensor body 330 may be inverted or upside down such that the top of the sensor is in contact with the substrate electrode and only the outer contact aperture 315 is filled with the electrolyte. The second method may be referred to as standard bottom up plating. In this configuration, the sensor body 330 is placed right side up on the substrate electrode such that the bottom layer 310 is in contact with the substrate electrode and the apertures 315 and 320, access hole 325, and cavity 335 are filled with the electrolyte.

Once a voltage or current is applied to the cell, portions of the sensor body 330 filled with electrolyte may be metalized with conducting material 340 starting at the contact area with the substrate electrode. Time, voltage or current, and electrolyte may be changed to control the rate of the reaction and degree of metallization in the sensor. A contact layer of conducting material 340 may extend on the top of the sensor body 330 from the outer contact aperture 315 to the electrode apertures 340.

As shown in FIG. 3, step d includes deposition of electrodes 345. Electrodes 345 may be electrochemically deposited on the sensor body 330 adjacent the electrode apertures 320. Standard bottom up plating may be used to deposit electrodes 345 after the apertures 315 and 320 have been metalized. Voltage or current from the cell may transfer through the conducting material 340 to the electrolyte in contact with the electrode vias. As discussed above time, voltage or current, and electrolyte may be changed to control the rate of the reaction and degree of electrode deposited on the sensor. In some aspects, electrodes may be different compositions by using a split substrate electrode with one portion conducting while another portion is insulating. Electrolytes may be exchanged resulting in different electrode compositions.

Figure 4:
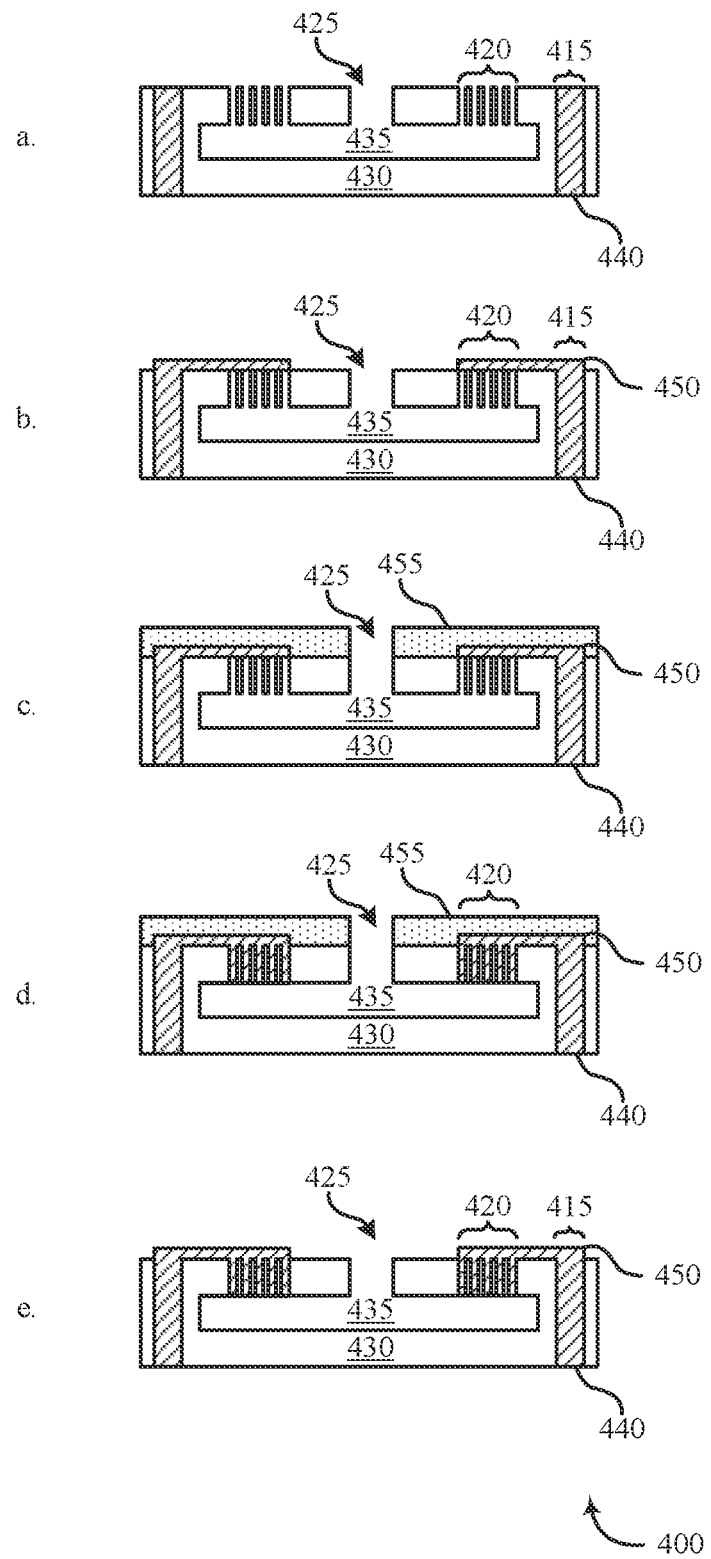
FIG. 4 illustrates a cross-sectional view of an example of a method for formation of a glass electrochemical sensor in accordance with various aspects of the present disclosure.

FIG. 4 illustrates an example of a method 400 for formation of a glass electrochemical sensor in accordance with various aspects of the present disclosure. In this example, there are five steps shown in method 400. In other examples, there may be more or less steps to the process by combining or dividing steps. This method 400 of forming a sensor will be explained in greater detail with respect to a glass electrochemical sensor, however, the method 400 may be applied to a variety of sensors. Method 400 may be a portion of method 300.

As illustrated in FIG. 4, step a includes a sensor body 430 with outer contact apertures 415, electrode apertures 420, access hole 425, and cavity 435. The outer contact apertures 415 are shown as filled with conducting material 440. This metalized pattern in the sensor body may be a result of inverted bottom up plating. The method shown is configured to metalized the electrode apertures 420.

As shown in FIG. 4, step b includes depositing a contact layer 450 that may be made up of conducting material 450. Contact layer 450 may be deposited on to the top of the sensor body 430 from the outer contact via to the electrode apertures 420. The deposition of contact layer 450 may be carried out with thin film deposition as well as other well-known deposition techniques.

As illustrated in FIG. 4, step c includes coving the top of the sensor body 430 with a masking layer 455. Masking layer 455 may be deposited on both sides of the access hole 425. Thus, allowing electrolyte to enter the cavity 435 through access hole 425.

As shown in FIG. 4, step d includes metalizing the electrode apertures 420 to form electrode vias of conducting material 440. Electrode apertures 420 may be electrochemically metalized using bottom up plating. In this case, the voltage or current across the cell is transferred through the conducting material 440 to the electrolyte filled within the electrode apertures 420. In some examples, the conducting material 440 of the electrode via may be different than the conducting material 440 of outer contact TGV. As illustrated in FIG. 4, step e includes removing masking layer 455 after the electrode vias are formed.

Figure 5:
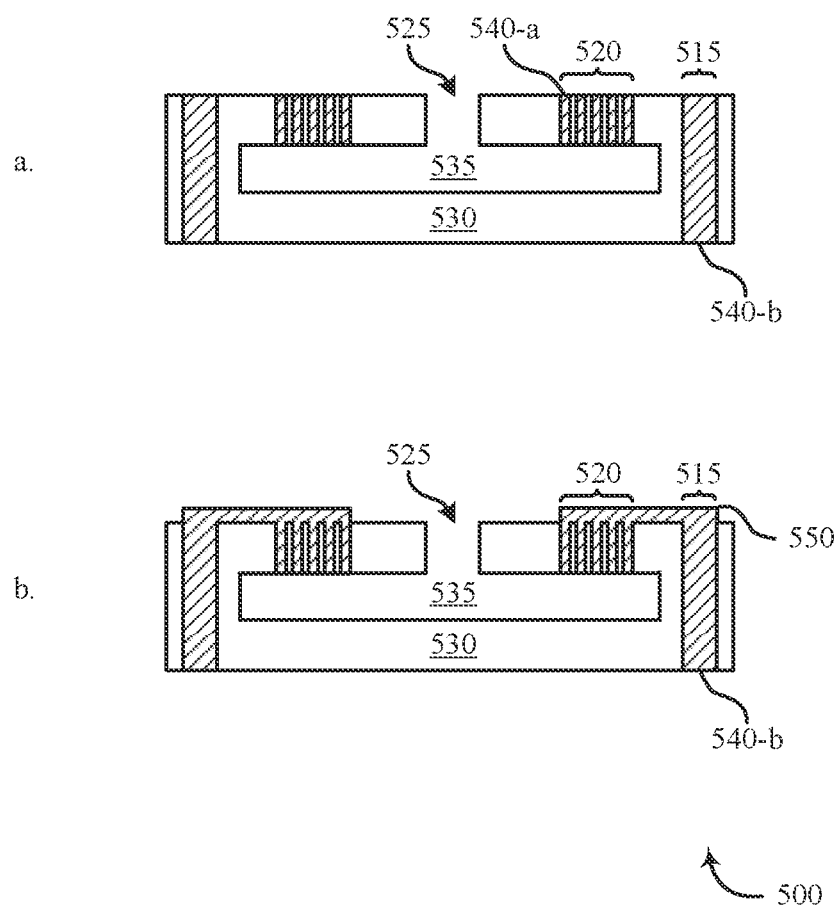
FIG. 5 illustrates a cross-sectional view of an example of a method for formation of a glass electrochemical sensor in accordance with various aspects of the present disclosure.

FIG. 5 illustrates an example of a method 500 for formation of a glass electrochemical sensor in accordance with various aspects of the present disclosure. In this example, there are two steps shown in method 500. In other examples, there may be more or less steps to the process by combining or dividing steps. This method 500 of forming a sensor will be explained in greater detail with respect to a glass electrochemical sensor, however, the method 500 may be applied to a variety of sensors. Method 500 may be a portion of method 300.

As illustrated in FIG. 5, step a includes a sensor body 530 with outer contact apertures 515, electrode apertures 520, access hole 525, and cavity 535. The electrode apertures 520 are shown filled with conducting material 540-a. The outer contact apertures 515 are shown as filled with conducting material 540-b. In some cases, conducting materials 540-a and 540-b may be different. This metalized pattern in the sensor body may be a result of inverted bottom up plating. In other cases, conducting materials 540-a and 540-b may be the same. This metalized pattern in the sensor body may be a result of standard bottom up plating. The conducting materials 540 may be made up of stainless steel, copper, gold, aluminum, silver, platinum, tin, lead, an alloy, a metal oxide, a conductive polymer, or a combination thereof. The method shown is configured to connect the metalized vias electrically with a contact layer 550.

As shown in FIG. 5, step b includes depositing a contact layer 550 that may be made up of the conducting material 540. Contact layer 550 may be deposited on to the top of the sensor body 530 from the outer contact via 515 to the electrode vias 520. The deposition of contact layer 550 may be carried out with thin film deposition as well as other well-known deposition techniques.

Figure 6:
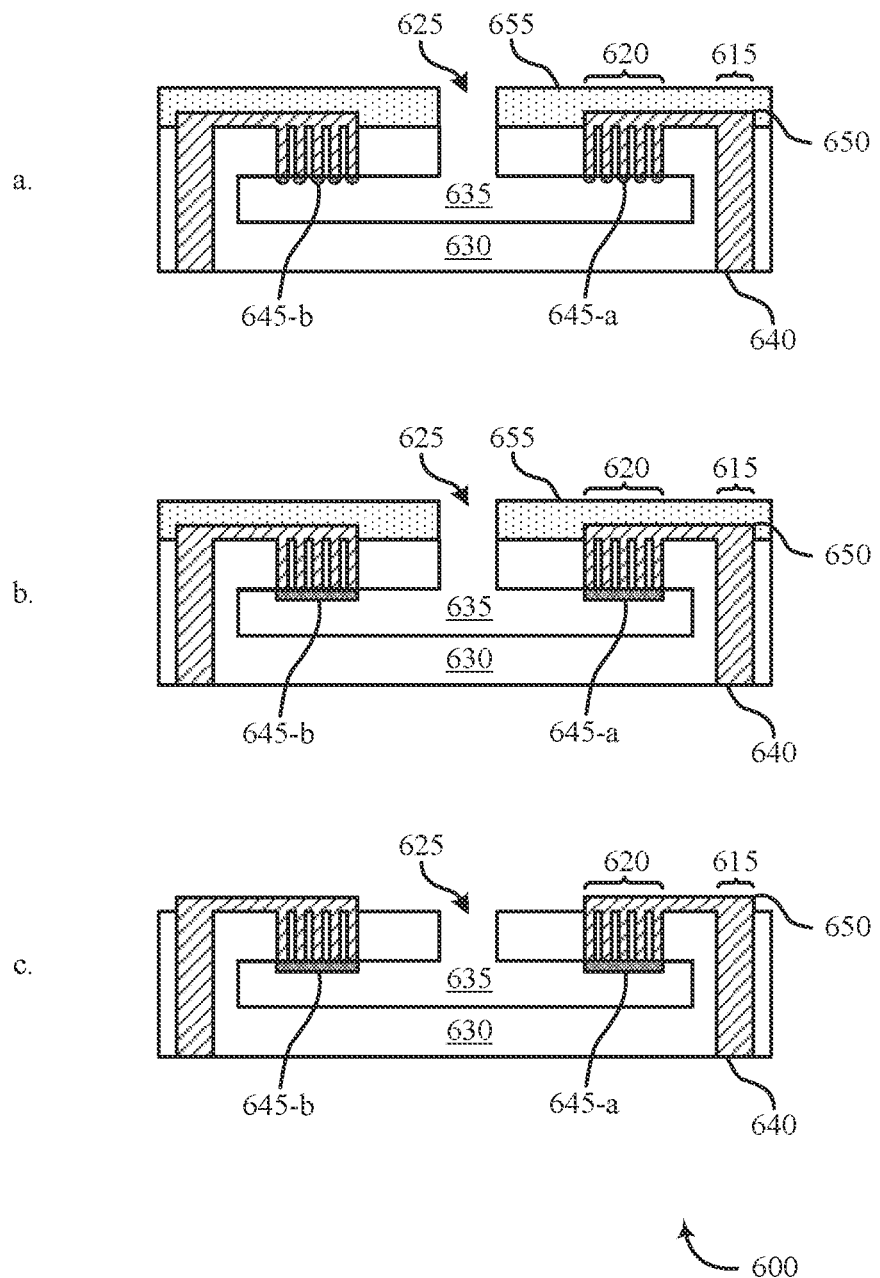
FIG. 6 illustrates a cross-sectional view of an example of a method for formation of electrodes in a glass electrochemical sensor in accordance with various aspects of the present disclosure.

FIG. 6 illustrates an example of a method 600 for formation of electrodes in a glass electrochemical sensor in accordance with various aspects of the present disclosure. In this example, there are three steps shown in method 600. In other examples, there may be more or fewer steps to the process by combining or dividing steps. This method 600 of forming a sensor will be explained in greater detail with respect to a glass electrochemical sensor, however, the method 600 may be applied to a variety of sensors. Method 600 may be a portion of method 300 and may be used in combination with method 400 or 500.

As illustrated in FIG. 6, step a includes a sensor body 630 with outer contact apertures 615, electrode apertures 620, access hole 625, cavity 635, contact layer 655, and electrodes 645. The outer contact TGV 615, electrode vias 620, and contact layer 650 are shown filled with conducting material 640. In step a, electrochemical deposition of a single layer of discontinuous electrodes 645-a and 645-b may occur. Electrodes 645 may be electrochemically deposited on the sensor body 630 adjacent the electrode vias 620. Standard bottom up plating may be used to deposit electrodes 645 after the apertures 615 and 620 have been metalized. Voltage or current from the cell may transfer through the conducting material 640 to the electrolyte in contact with the electrode vias. As discussed above, time, voltage or current, and electrolyte composition may be changed to control the rate of the reaction and degree of electrode deposited on the sensor. In some aspects, electrodes 645-a and 645-b may be different compositions by using a split substrate electrode with one portion conducting while another portion is insulating. Electrolytes may be exchanged, resulting in different electrode compositions. Electrodes 645 may be composed of any appropriately sensitive conducting material including, but in no way limited to, platinum, silver, gold, copper, an alloy, a metal oxide, a conductive polymer or a combination thereof.

As shown in FIG. 6, step b includes further electrochemical deposition of multiple layers of continuous electrodes 645-a and 645-b across electrode vias 620. In some examples, continuous electrodes 645 may act as a macro electrode and may all be electrically connected to the electrode vias 620, contact layer 650, and outer contact TGV 615. As illustrated in FIG. 6, step c includes removing masking layer 655 after electrode deposition is complete.

Figure 7:
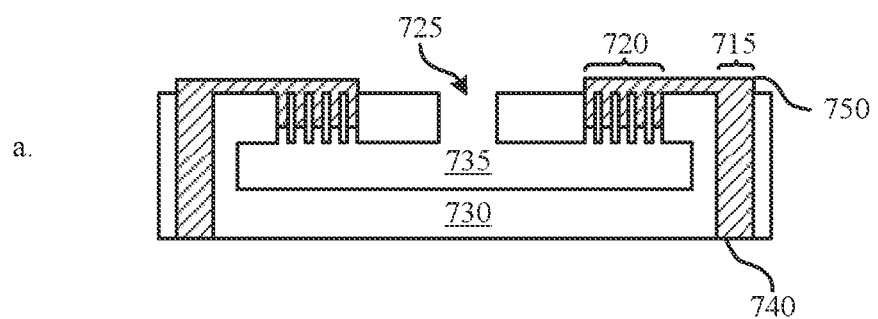
FIG. 7 illustrates a cross-sectional view of an example of a method for formation of electrodes in a glass electrochemical sensor in accordance with various aspects of the present disclosure.
Figure 7:
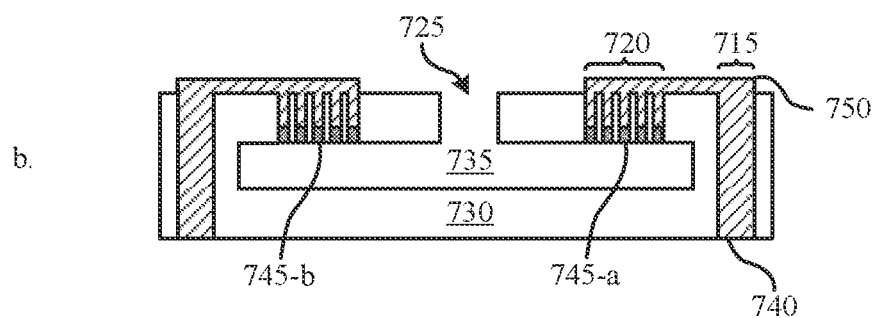
Figure 7:
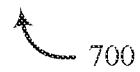

FIG. 7 illustrates an example of a method 700 for formation of electrodes in a glass electrochemical sensor in accordance with various aspects of the present disclosure. In this example, there are two steps shown in the exemplary method 700. In other examples, there may be more or fewer steps to the process by combining or dividing steps. This method 700 of forming a sensor will be explained in greater detail with respect to a glass electrochemical sensor, however, the method 700 may be applied to a variety of sensors. Method 700 may be a portion of method 300 and may be used in combination with method 400, 500, or 600.

As illustrated in FIG. 7, step a includes a sensor body 730 with outer contact apertures 715, electrode apertures 720, access hole 725, cavity 735, and contact layer 755. The outer contact TGV 715, electrode vias 720, and contact layer 750 are shown filled with conducting material 740. Specifically, conducting material 740 may partially fill the electrode apertures 720. This may be the result of time and/or voltage or current controlled plating or the result of etching filled electrode apertures 720.

As shown in FIG. 7, step b may include electrochemical deposition of discontinuous electrodes 745-a and 745-b. Electrodes 745 may be electrochemically deposited on the sensor body 730 within the empty space of partially filled electrode apertures 720. Standard bottom up plating may be used to deposit electrodes 745 after the apertures 715 and 720 have been metalized. Voltage or current from the cell may transfer through the conducting material 740 to the electrolyte in contact with the electrode vias. As discussed above time, voltage or current, and electrolyte may be changed to control the rate of the reaction and degree of electrode deposited on the sensor. In some aspects, electrodes 745-a and 745-b may be different compositions by using a split substrate electrode with one portion conducting while another portion is insulating. Electrolytes may be exchange resulting in different electrode compositions. Electrodes 645 may be composed of any appropriate depositable conductor including, but in no way limited to, platinum, silver, gold, copper, an alloy, a metal oxide, a conductive polymer or a combination thereof. In some examples, electrodes 645 may act as microelectrodes. Microelectrodes may have a high signal to noise ratio (SNR), which may increase the sensitivity of the sensor.

Figure 8:
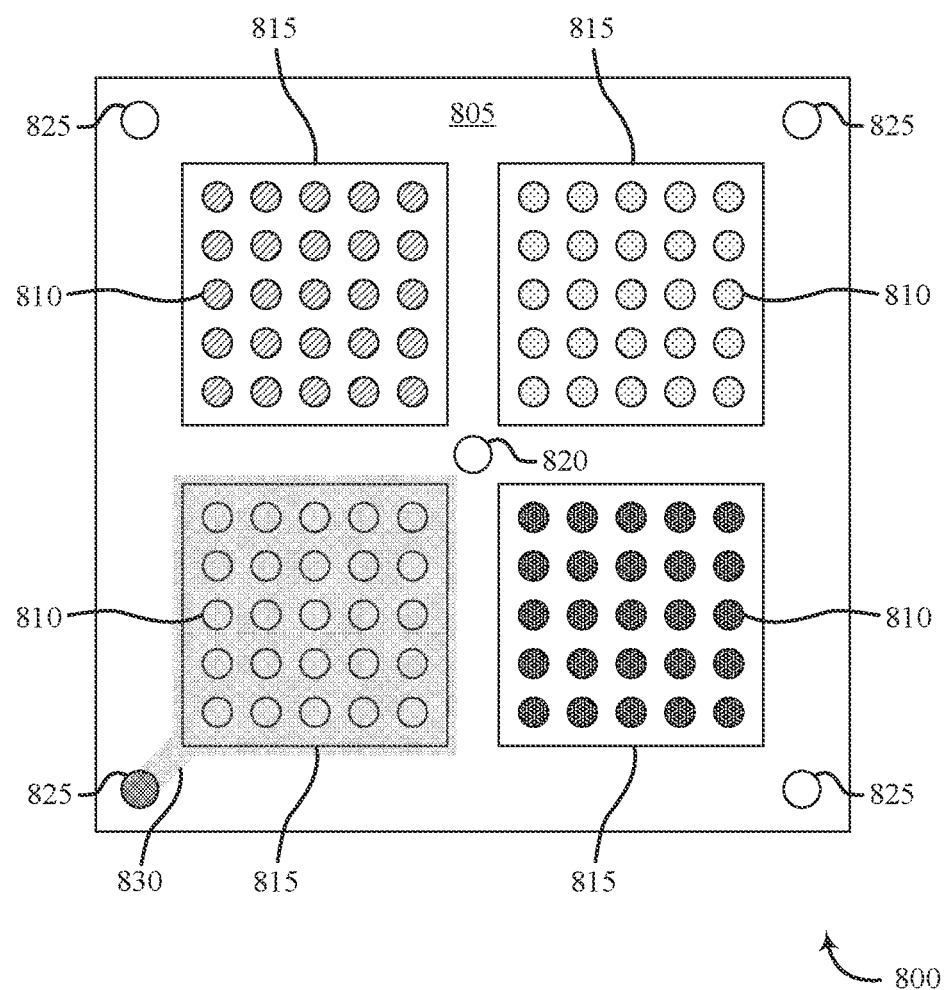
FIG. 8 illustrates a top view of an example glass electrochemical sensor with four electrodes in accordance with various aspects of the present disclosure.

FIG. 8 illustrates a top view of an example glass electrochemical sensor 800 with four electrodes 815 in accordance with various aspects of the present disclosure. Sensor 800 will be explained in greater detail with respect to a glass electrochemical sensor, however, the configuration may be applied to a variety of sensors. Sensor 800 may be formed by methods 300, 400, 500, 600, 700, or some combination thereof.

Sensor 800 may include an electrode plate 805, electrode TGVs 810, electrode units 815, access hole 820, outer contact TGVs 825, and contact layer 830. An electrode plate 805 may include one or more electrode units 815. In some examples, each electrode unit 815 may be made up of the different materials. In other examples, some electrode units 815 may have the same materials while other units are made of different materials. Different materials allow different analytes to be sensed. Each electrode unit 815 may include an array of electrode TGVs 810. Contact layer 830 provides electrical connection between the electrode unit 815 and the outer contact TGV 825. Although not shown, each electrode unit 815 may have a contact layer to electrically connect to each respective outer contact via 825. The electrode TGVs 810 may be electrically connected to an external circuitry while being chemically isolated from the circuitry. Access hole 820 allows an electrolyte to enter and fill a cavity of the sensor 800. The volume of the electrolyte may be controlled by controlling the geometry of the electrode plate 805.

Figure 9:
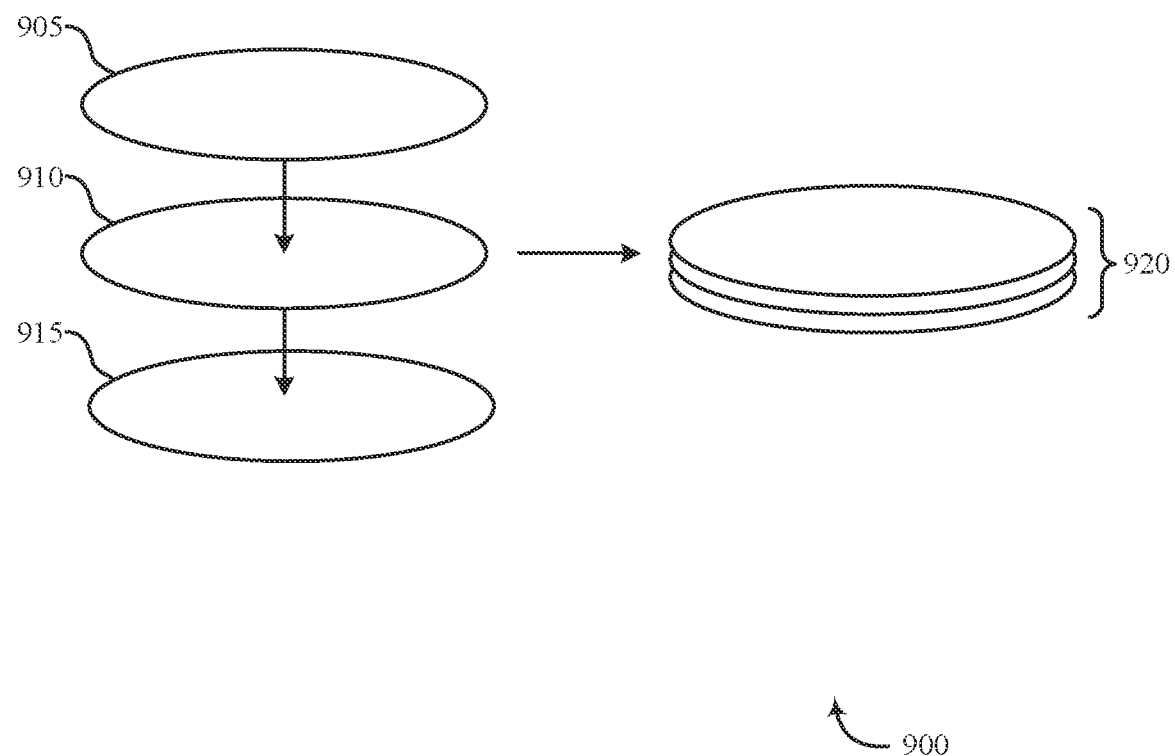
FIG. 9 illustrates an example method for wafer-level processing and formation of a three-layer stack glass electrochemical sensor in accordance with various aspects of the present disclosure.

FIG. 9 illustrates an example method 900 for wafer-level processing and formation of a three-layer stack glass electrochemical sensor in accordance with various aspects of the present disclosure. The methods of forming the sensor described in FIGS. 3 to 7 may apply to sensors of two or more component layers. The methods 300, 400, 500, 600, and 700 of forming a sensor described above may be applied to wafer level processing. FIG. 9 is an example method using three layers, but may be applied to more or less layers.

Method 900 may include a top glass layer 905, which may represent a glass substrate, a middle glass layer 910, bottom glass layer 915, and a bonded glass sensor stack 920. In some examples, the bonding may be accomplished using an adhesive if the chemistry is chemically compatible, glass frit, or by laser sealing. Once bonded, the stack 920 may undergo the methods 300, 400, 500, 600, and 700 of forming a sensor described above in FIGS. 3, 4, 5, 6, and 7. As a result of these methods, the top glass layer 905 in the stack 920 will contain multiple electrode vias and possibly electrode units as shown in FIG. 8. The middle glass layer 910 can contain a number of through orifices configured to define a cavity within the electrochemical sensor. Once metalized, each of the assembled glass-based electrical sensors can be cut or punched out from the stack 920 and electrically connected to a printed circuit board (PCB) or other processing interface, and then for use in an electronic device. Example electronic devices include, but are in no way limited to, smart phones, wearables, automobiles, home security monitoring, TSA monitoring devices, emissions sensors, cabin air quality sensors, indoor air quality sensors, and standard appliances, to name a few.

Figure 10:
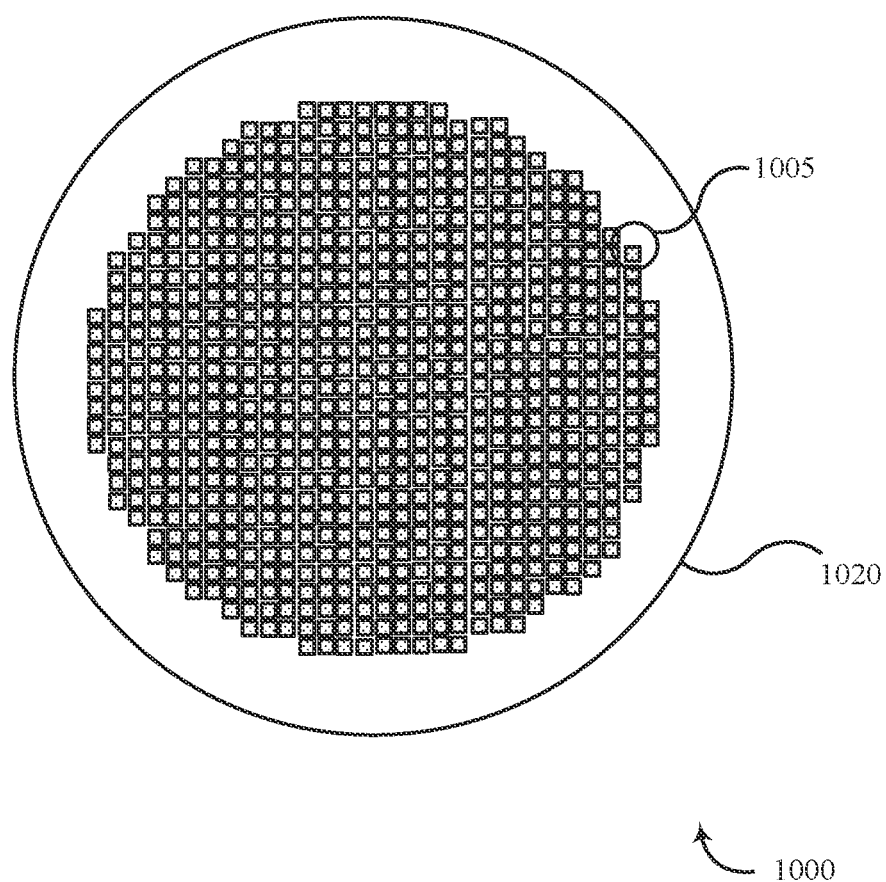
FIG. 10 illustrates an example of TGV placement layout on a wafer in accordance with various aspects of the present disclosure.

FIG. 10 illustrates an example of TGV placement layout on a wafer in accordance with various aspects of the present disclosure. FIG. 10 illustrates a wafer layout 1000, having 6102 die level layouts 1005 per wafer 1020. Each die level layout 1005 may be one sensor with one or more electrode units as shown in FIG. 8. As is illustrated in FIG. 10, the present exemplary system and method enable the rapid production of a high volume of glass-based electrochemical sensors. Specifically, one advantage of using glass wafers with laser processing to form the TGVs is the ability to apply wafer-level processing to the manufacturing process, thereby reducing cost and increasing manufacturability capabilities.

Figure 11:
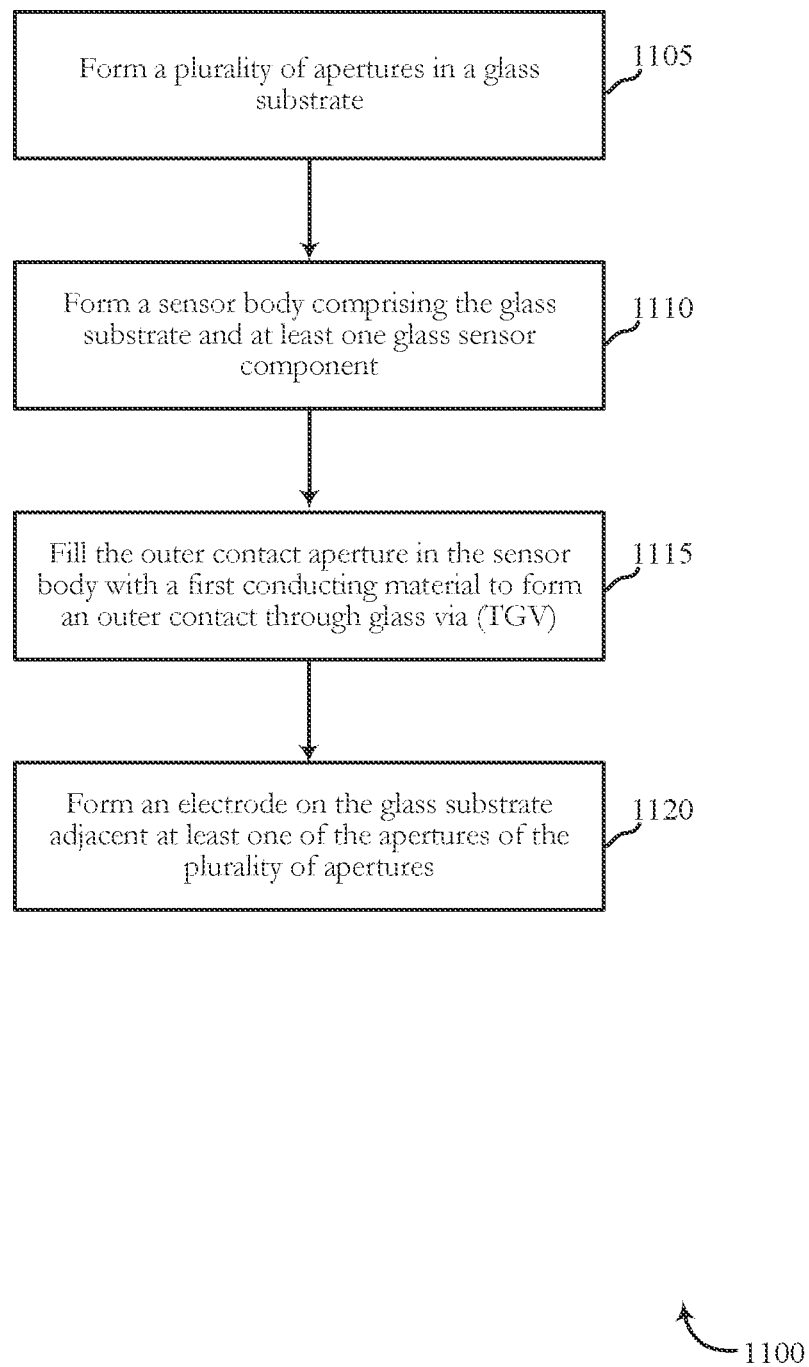
FIG. 11 shows a flow chart illustrating a method for formation of a glass electrochemical sensor in accordance with various aspects of the present disclosure.

FIG. 11 shows a flow chart illustrating an exemplary method 1100 for the formation of a glass electrochemical sensor 100 in accordance with various aspects of the present disclosure. The operations of method 1100 may be performed on a glass electrochemical sensor.

At block 1105 a plurality of apertures may be formed in a glass substrate. The operations of block 1105 may be performed according to the methods described with reference to FIGS. 1 and 3.

At block 1110 a sensor body may be formed including the glass substrate and at least one glass sensor component. The operations of block 1110 may be performed according to the methods described with reference to FIGS. 3 and 9.

At block 1115 the outer contact aperture in the sensor body may be filled with a first conducting material to form an outer contact TGV. The operations of block 1115 may be performed post assembly of the sensor body according to the methods described with reference to FIGS. 1 and 3 through 5.

At block 1120 an electrode may be formed on the glass substrate adjacent at least one of the apertures of the plurality of apertures. The operations of block 1120 may be performed according to the methods described with reference to FIGS. 1, 3, 6 and 7.

Figure 12:
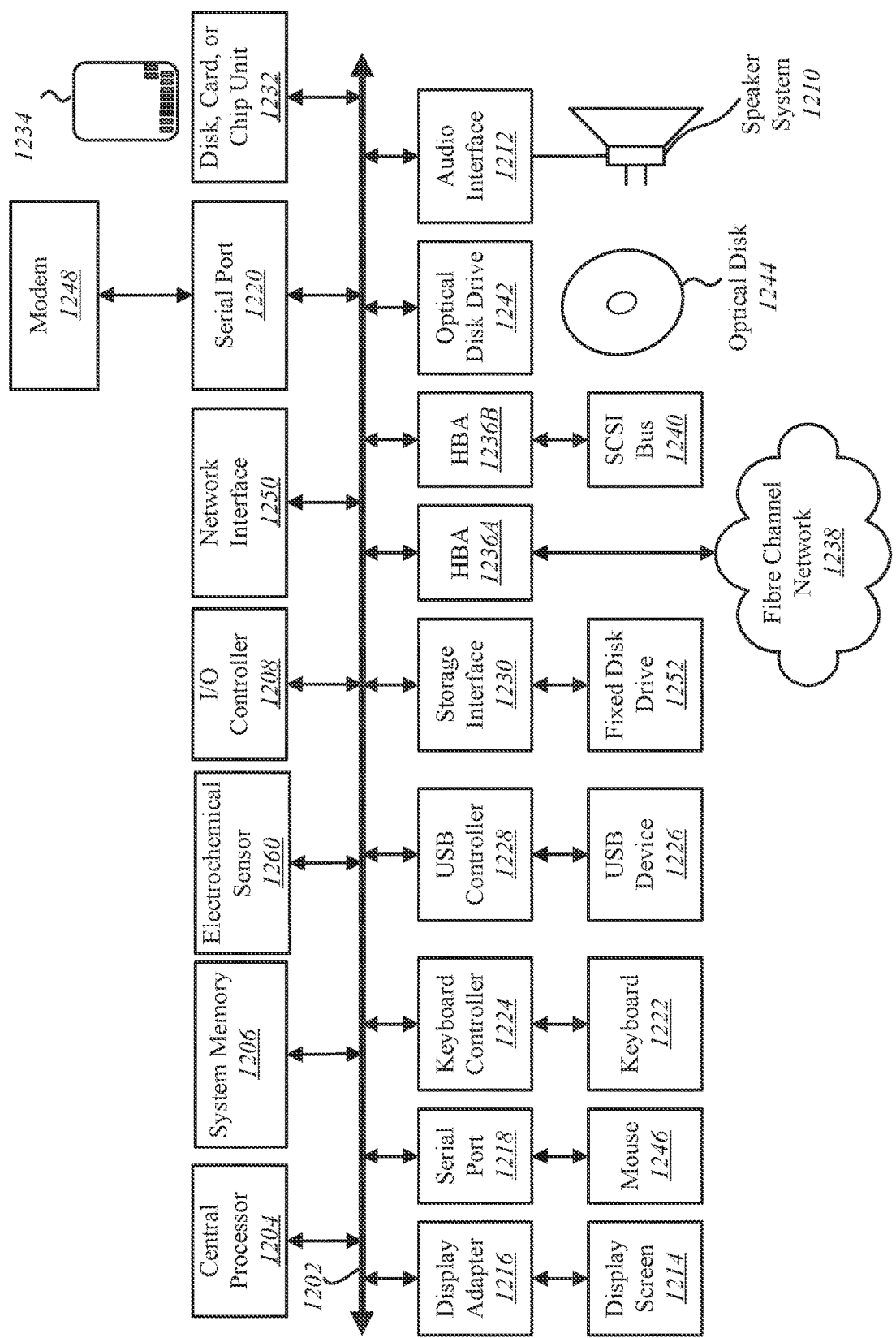
FIG. 12 shows a block diagram of an example computer system suitable for implementing the present systems and methods.

FIG. 12 shows a block diagram of an example computer system 1200 suitable for implementing the present exemplary glass electrochemical sensor 1260. The depicted computer system 1200 may be one example of a device described above, such as a smart phone, a wearable, an automobile, a home security monitoring system, or another appliance. While described in detail with a number of components, the present exemplary glass electrochemical sensor 1260 can be incorporated into any number of computing systems including all, some, or none of the elements detailed in FIG. 12. Particularly, the present glass electrochemical sensor 1260 can be connected to a system on a chip (SOC) device wherein the functionality of the sensor is associated with the other components on the chip, rather than through a bus or other system.

As shown in FIG. 12, the computer system 1200 includes a bus 1202 which interconnects major subsystems of computer system 1200, such as a central processor 1204, a system memory 1206 (typically RAM, but which may also include ROM, flash RAM, or the like), an input/output controller 1208, an external audio device, such as a speaker system 1210 via an audio output interface 1212, an external device, such as a disk, card, or chip unit 1232 operative to receive a disk, memory card, or a chip 1234; a display screen 1214 via display adapter 1216; serial ports 1218 and mouse 1220; a keyboard 1222 (interfaced with a keyboard controller 1224); multiple USB devices 1226 (interfaced with a USB controller 1228); a storage interface 1230; a host bus adapter (HBA) interface card 1236A operative to connect with a Fibre Channel network 1238; a host bus adapter (HBA) interface card 1236B operative to connect to a SCSI bus 1240; and an optical disk drive 1242 operative to receive an optical disk 1244. Also included are a mouse 1246 (or other point-and-click device, coupled to bus 1202 via serial port 1218), a modem 1248 (coupled to bus 1202 via serial port 1220), and a network interface 1250 (coupled directly to bus 1202).

Bus 1202 allows data communication between central processor 1204 and system memory 1206, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components or devices. Applications resident with computer system 1200 are generally stored on and accessed via a non-transitory computer readable medium, such as a hard disk drive (e.g., fixed disk 1252), an optical drive (e.g., optical drive 1242), or other storage medium. Additionally, applications can be in the form of electronic signals modulated in accordance with the application and data communication technology when accessed via network modem 1248 or interface 1250.

Storage interface 1230, as with the other storage interfaces of computer system 1200, can connect to a standard computer readable medium for storage and/or retrieval of information, such as a fixed disk drive 1252. Fixed disk drive 1252 may be a part of computer system 1200 or may be separate and accessed through other interface systems. Modem 1248 may provide a direct connection to a remote server via a telephone link or to the Internet via an internet service provider (ISP). Network interface 1250 may provide a direct connection to a remote server via a direct network link to the Internet via a POP (point of presence). Network interface 1250 may provide such connection using wireless techniques, including digital cellular telephone connection, Cellular Digital Packet Data (CDPD) connection, digital satellite data connection or the like.

As illustrated in FIG. 12, the electrochemical sensor 1260 may be integrated into the computer system 1200. When the electrochemical sensor detects a chemical or a programmed level of a chemical, a signal may be transmitted through the bus to the central processor 1204, which may then access instructions on the system memory 1206, that dictate what subsequent action is taken by the central processor 1204, if any.

Many other devices or subsystems (not shown) may be connected in a similar manner (e.g., document scanners, digital cameras and so on). Conversely, all of the devices shown in FIG. 12 need not be present to practice the present systems and methods. The devices and subsystems can be interconnected in different ways from that shown in FIG. 12. The operation of at least some of the computer system 1200 such as that shown in FIG. 12 is readily known in the art and is not discussed in detail in this application. Code to implement the present disclosure can be stored in a non-transitory computer-readable medium such as one or more of system memory 1206; a disk, memory card, or chip 1234; a fixed disk 1252; or optical disk 1244. The operating system provided on computer system 1200 may be MS-DOS®, MS-WINDOWS®, OS/2 ®, UNIX®, Linux®, or another known operating system.

It should be appreciated that some components, features, and/or configurations may be described in only one embodiment, but these same components, features, and/or configurations may be applied or used in or with many other embodiments and should be considered applicable to the other embodiments, unless stated otherwise or unless such a component, feature, and/or configuration is technically impossible to use with the other embodiment. Thus, the components, features, and/or configurations of the various embodiments may be combined in any manner and such combinations are expressly contemplated and disclosed by this statement.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.).

References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

The subject matter recited in the claims is not coextensive with and should not be interpreted to be coextensive with any embodiment, feature, or combination of features shown in this document. This is true even if only a single embodiment of the feature or combination of features is illustrated and described in this document. Thus, the appended claims should be given their broadest interpretation in view of the prior art and the meaning of the claim terms.

Spatial or directional terms, such as "left," "right," "front," "back," and the like, relate to the subject matter as it is shown in the drawings. However, it is to be understood that the described subject matter may assume various alternative orientations and, accordingly, such terms are not to be considered as limiting.

Articles such as "the," "a," and "an" may connote the singular or plural. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should at least be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

All disclosed numerical values are to be understood as being variable from 0-100% in either direction and thus provide support for claims that recite such values or any and all ranges or subranges that may be formed by such values.

For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range (e.g., 15.2).

The flowchart and block diagrams in the flow diagrams illustrate the architecture, functionality, and operation of possible implementations of systems, methods, and products according to various embodiments of the present embodiments.

It should be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions. These computer program instructions may also be stored in a computer-readable medium that may direct a computer or other programmable data processing apparatus to function in a particular manner, such that the instructions stored in the computer-readable medium produce an article of manufacture including instruction means which implement the function/act specified in the flowchart and/or block diagram block or blocks.

The techniques described in this document may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The operations presented in this document are not inherently related to any particular apparatus. Various general-purpose systems may also be used with programs in accordance with the teachings in this document, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described in this document, and any references to specific languages are provided for disclosure of enablement and best mode of the present exemplary system and method.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A glass electrochemical sensor, comprising:
   a glass sensor body comprising a plurality of through glass vias (TGVs), wherein outer contact apertures of two or more glass sensor components forming the glass sensor body are configured to be aligned when empty to form two or more of the plurality of TGVs, a plurality of outer contact TGVs of the glass sensor body comprising the outer contact apertures at least partially filled with a conducting material; and
   at least two electrodes disposed within a continuous cavity formed by the two or more glass sensor components, the cavity disposed within the glass sensor body, each of the at least two electrodes disposed on a surface of the glass sensor body adjacent to at least a different one of the plurality of outer contact TGVs;
   wherein the plurality of TGVs further comprises an access hole in the glass sensor body configured to allow access to the at least two electrodes via the cavity; and
   wherein the at least two electrodes are disposed on the surface of the glass sensor body by bottom up plating.

2. The glass electrochemical sensor of claim 1, wherein the two or more glass sensor components comprise a glass substrate that comprises the plurality of outer contact TGVs and electrode vias.

3. The glass electrochemical sensor of claim 1, wherein at least two of the plurality of TGVs are electrode vias that include conductive material that is electrically connected to the at least two electrodes.

4. The glass electrochemical sensor of claim 3, wherein:
   the electrode vias are positioned around a center of the glass sensor body; and
   the plurality of outer contact TGVs is positioned about a periphery of the glass sensor body.

5. The glass electrochemical sensor of claim 3, wherein the glass sensor body further comprises:
   a plurality of contact layers electrically connecting the conductive material in the electrode vias with the conductive material in the plurality of outer contact TGVs.

6. The glass electrochemical sensor of claim 1, wherein:
   the two or more glass sensor components comprise a glass substrate that comprises the plurality of outer contact TGVs and electrode vias, and
   the two or more glass sensor components are bonded together such that the glass sensor body is sealed by glass on all sides except a side defined by the glass substrate.

7. The glass electrochemical sensor of claim 6, wherein the two or more glass sensor components are bonded together by at least one of adhesive, glass frit, or laser sealing.

8. The glass electrochemical sensor of claim 1, wherein the glass sensor body, glass sensor components, and glass substrate comprises at least one of quartz, soda-lime glass, aluminosilicate glass, alkali-aluminosilicate glass, borosilicate glass, alkali-borosilicate glass, aluminoborosilicate glass, alkali-aluminoborosilicate glass, or fused silica glass.

9. The glass electrochemical sensor of claim 1, wherein an electrolyte at least partially fills the access hole and is in contact with the at least two electrodes.

10. The glass electrochemical sensor of claim 4, wherein each of the electrode vias extends between opposing external surfaces of the glass sensor body.

11. The glass electrochemical sensor of claim 10, wherein for each of the electrode vias, the conductive material in the electrode via extends laterally from the electrode via along one of the opposing external surfaces of the glass sensor body to a corresponding electrode of the at least two electrodes.

12. The glass electrochemical sensor of claim 1, wherein a first electrode of the at least two electrodes is selected from one of a sensing electrode, a counter electrode, and a reference electrode, and a second electrode of the at least two electrodes is selected from a different one of the sensing electrode, the counter electrode, and the reference electrode.

13. An electronic device comprising a glass electrochemical sensor, the glass electrochemical sensor comprising:
 a glass sensor body comprising a plurality of through glass vias (TGVs), wherein outer contact apertures of two or more glass sensor components forming the glass sensor body are configured to be aligned when empty to form two or more of the plurality of TGVs, a plurality of outer contact TGVs of the glass sensor body comprising the outer contact apertures at least partially filled with a conducting material; and
 at least two electrodes disposed within a continuous cavity formed by the two or more glass sensor components, the cavity disposed within the glass sensor body, each of the at least two electrodes disposed on a surface of the glass sensor body adjacent to at least a different one of the plurality of outer contact TGVs;
 wherein the plurality of TGVs further comprises an access hole in the glass sensor body configured to allow access to the at least two electrodes via the cavity;
 wherein the at least two electrodes are disposed on the surface of the glass sensor body by bottom up plating; and
 wherein the two or more glass sensor components comprise a glass substrate that comprises the plurality of outer contact TGVs and electrode vias.

14. A glass electrochemical sensor, comprising:
 a glass sensor body comprising a plurality of through glass vias (TGVs) and a cavity, wherein outer contact apertures of two or more glass sensor components forming the glass sensor body are configured to be aligned when empty to form two or more of the plurality of TGVs, a plurality of outer contact TGVs of the glass sensor body comprising the outer contact apertures at least partially filled with a conducting material, the conducting material that extends along an external outer surface of the glass sensor body; and
 at least two electrodes disposed within electrode apertures formed between the external outer surface of the glass sensor body, each electrode aperture adjacent to a different one of the outer contact apertures, each of the at least two electrodes having a first composition throughout a first portion of a corresponding electrode aperture and a second composition throughout a second portion of the corresponding electrode aperture;
 wherein the plurality of TGVs further comprises an access hole in the glass sensor body configured to allow access to the at least two electrodes via the cavity.

* * * * *